United States Patent
Sharma et al.

(10) Patent No.: US 9,559,222 B2
(45) Date of Patent: Jan. 31, 2017

(54) METHOD AND TOOL TO REVERSE THE CHARGES IN ANTI-REFLECTION FILMS USED FOR SOLAR CELL APPLICATIONS

(71) Applicants: Vivek Sharma, Hillsboro, OR (US); Clarence Tracy, Tempe, AZ (US)

(72) Inventors: Vivek Sharma, Hillsboro, OR (US); Clarence Tracy, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 140 days.

(21) Appl. No.: 14/456,477

(22) Filed: Aug. 11, 2014

(65) Prior Publication Data

US 2015/0050771 A1 Feb. 19, 2015

Related U.S. Application Data

(60) Provisional application No. 61/865,730, filed on Aug. 14, 2013.

(51) Int. Cl.
*H01L 31/0216* (2014.01)
*H01L 31/18* (2006.01)

(52) U.S. Cl.
CPC ....... *H01L 31/02168* (2013.01); *H01L 31/186* (2013.01); *Y02E 10/50* (2013.01); *Y02P 70/521* (2015.11)

(58) Field of Classification Search
CPC .. H01L 27/14; H01L 27/142; H01L 31/02008; H01L 31/02168; H01L 31/186; Y02E 10/50; Y02P 70/521
See application file for complete search history.

(56) References Cited

U.S. PATENT DOCUMENTS

| | | | |
|---|---|---|---|
| 7,993,700 B2 | 8/2011 | Zhou et al. | |
| 2005/0236576 A1* | 10/2005 | Yagi | G01J 1/429 250/372 |
| 2009/0301557 A1 | 12/2009 | Agostinelli et al. | |
| 2010/0154883 A1 | 6/2010 | Komatsu et al. | |
| 2011/0240114 A1* | 10/2011 | Stewart | H01L 31/02167 136/256 |
| 2012/0024336 A1* | 2/2012 | Hwang | H01L 31/02167 136/244 |

(Continued)

OTHER PUBLICATIONS

V. Sharma et al., "Study and manipulation of charges present in silicon nitride films", 39th IEEE Photovoltaic Specialists Conference (PVSC), Tampa, FL, Jun. 2013.

(Continued)

*Primary Examiner* — Mohammad Islam
*Assistant Examiner* — Mikka Liu
(74) *Attorney, Agent, or Firm* — Quarles & Brady LLP

(57) ABSTRACT

A method is provided for making a solar cell. The method includes providing a stack including a substrate, a barrier layer disposed on the substrate, and an anti-reflective layer disposed on the barrier layer, where the anti-reflective layer has charge centers. The method also includes generating a corona with a charging tool and contacting the anti-reflective layer with the corona thereby injecting charge into at least some of the charge centers in the anti-reflective layer. Ultra-violet illumination and temperature-based annealing may be used to modify the charge of the anti-reflective layer.

20 Claims, 8 Drawing Sheets

(56) References Cited

U.S. PATENT DOCUMENTS

2013/0202994 A1* 8/2013 Shimada ............ G03G 5/0614
430/56
2013/0247972 A1 9/2013 Mungekar et al.

OTHER PUBLICATIONS

V. Sharma, "Study of Charges Present in Silicon Nitride Thin Films and Their Effect on Silicon Solar Cell Efficiencies", PhD thesis, Arizona State University, Dec. 2013.
A. Aberle, "Surface Passivation of Crystalline Silicon Solar Cells: A Review", Prog. Photovolt. Res. Appl. 8, 473-487 (2000).
D. Krick et al., "Nature of the dominant deep trap in amorphous silicon nitride", Phys. Rev. B. 38(12) 8226-8229 (1988).
k Aberle, "Overview on SiN surface passivation of crystalline silicon solar cells", Solar Energy Materials & Solar Cells 65, 239-248 (2001).
S. Dauwe et al., "Experimental Evidence of Parasitic Shunting in Silicon Nitride Rear Surface Passivated Solar Cells", Prog. Photovolt: Res. Appl. 10, 271-278 (2002).
G. Dingemans et al., "Status and prospects of Al2O3-based surface passivation schemes for silicon solar cells", J. Vac. Sci. Technol. A 30, 040802-1-040802-27 (2012).
M. Crowder et al., "Photobleaching of lighy-induced paramagnetic defects in amorphous silicon nitride films", Appl. Phys. Lett. 57(19) 1995-1997 (1990).
D. Jousse et al., "Electron-spin-resonance study of defects in plasma-enhanced chemical vapor deposited silicon nitride", Appl. Phys. Lett. 52(6) 445-447 (1988).
F. Duerinckx et al., "Defect passivation of industrial multicrystalline solar cells based on PECVD silicon nitride", Solar Energy Materials & Solar Cells 72, 231-246 (2002).
A. El amrani et al., "Silicon nitride film for solar cells", Renewable Energy 33, 2289-2293 (2008).
J. Schmidt et al., "Highest-quality surface passivation of low-resistivity p-type silicon using stoichiometric PECVD silicon nitride", Solar Energy Materials & Solar Cells 65, 585-591 (2001).
Y. Ren et al., "Charge stability in LPCVD silicon nitride for surface passivation of silicon solar cells", 35th IEEE Photovoltaic Specialists Conference, pp. 000897-000901 (2010).
Y. Ren et al., "Charge Storage Stability in Silicon Nitride for Surface Passivation", 25th European Photovoltaic Solar Energy Conference and Exhibition / 5th World Conference on Photovoltaic Energy Conversion, Valencia, Spain, pp. 73-76 (2010).
D. Frohman-Bentchkowsky, "Charge Transport and Storage in Metal-Nitride-Oxide-Silicon (MNOS) Structures", J. Appl. Phys, 40(8) 3307-3319 (1969).
D. Frohman-Bentchkowsky, "The Metal-Nitride-Oxide-Silicon (MNOS) Transistor-Characteristics and Applications" Proc. IEEE 58(8) 1207-1219 (1970).
J. Chang et al, "Theory of MNOS Memory Transistor", IEEE Trans. Electron Dev. vol. ED-24, No. 5, 511-518 (1977).
K. Weber et al., "Improved silicon surface passivation achieved by negatively charged silicon nitride films", Appl. Phys. Lett. 94 063509-1-063509-3 (2009).
V. Kapoor et al., "Effects of oxide thickness on charge trapping in metal-nitride-oxide-semiconductor structures", J. Appl. Phys. 53(7) 5079-5085 (1982).
Y. Ren et al., "Effect of deposition conditions and thermal annealing on the charge trapping properties of SiNx films", Appl. Phys. Lett. 97, 202907-1-202907-3 (2010).
J. Lai et al., "High-Efficiency Large-Area Rear Passivated Silicon Solar Cells With Local Al-BSF and Screen-Printed Contacts", IEEE J. Photovoltaics 1(1) 16-21 (2011).

* cited by examiner

METHOD AND TOOL TO REVERSE THE CHARGES IN ANTI-REFLECTION FILMS USED FOR SOLAR CELL APPLICATIONS

CROSS-REFERENCE TO RELATED APPLICATIONS

This application claims the benefit of the U.S. Provisional Patent Application No. 61/865,730 filed on Aug. 14, 2013 and entitled "Method And Tool To Reverse The Charges In Anti-Reflection Films Used For Solar Cell Applications", the entire disclosure of which is hereby incorporated herein by reference.

STATEMENT REGARDING FEDERALLY SPONSORED RESEARCH

This invention was made with government support under 1041895 awarded from the National Science Foundation and the Department of Energy. The United States government has certain rights in the invention.

BACKGROUND OF THE INVENTION

The field of the invention relates to methods for thin film processing, and more specifically, to modifying charge states in anti-reflection films, particularly in solar cell applications.

Thin hydrogenated silicon nitride ($SiN_x$:H) films are typically utilized as anti-reflection coatings for the front surface of standard screen printed $n^+$-p crystalline silicon solar cells. The films improve cell efficiency by minimizing surface recombination by passivating the dangling bonds at the interface with atomic hydrogen released during high temperature annealing and by achieving a field effect passivation due to presence of net positive charges in the film. The positive charges present in the silicon nitride film originate from the charge on a specific silicon-nitrogen dangling bond (●$SiN_3$) known as K centers. According to charge distribution models, the positive charges originate from the formation of a thin layer of $SiO_xN_y$ (<2 nm) and the charge from K centers, and are assumed to be limited within the nitride film up to roughly 20 nm away from the Si—$SiN_x$ interface. For a typical $n^+$-p cell, the positive charges (~$5\times10^{11}$ $cm^{-2}$) enhance efficiency by effectively minimizing the surface recombination by way of keeping minority holes away from the surfaces of the $n^+$ emitter.

However, the same positive charges can create a depletion or inversion region when applied to p-type doped surfaces of the cells, depending on the doping concentration. When a depletion region is created at the surface, it leads to a higher surface recombination due to presence of both type of carriers. Further, the presence of an inversion layer adjacent to metal contact regions (such as rear p-type surfaces of $n^+$-p cell) will cause parasitic shunting thereby, degrading the cell performance. Therefore, p-doped surfaces require dielectric films carrying negative charge to shield minority electrons away from the surfaces. Currently, thin aluminum oxide ($Al_2O_3$) films with fixed negative charges are used for the rear of the p-type cells, as well as for the front of the n-type cells with p+ emitters. Although $Al_2O_3$ films provide good surface passivation, its wide industry usage is limited due to several shortcomings. First, the low rate (1-2 Å per cycle) of $Al_2O_3$ deposition using standard atomic layer deposition (ALD) methods prevents high volume manufacturing. Second, $Al_2O_3$ films have refractive indices not suitable as a standalone anti-reflection films and hence require $SiN_x$/$Al_2O_3$ stack structures. Third, no materials are currently available that can easily penetrate $Al_2O_3$ films for achieving proper ohmic contact in subsequent solar cell processing.

Future cell architectures may rely heavily on the effectiveness of surface charges to minimize surface recombination and enhance cell efficiencies. As such, thinner substrates, lightly doped emitters and migration to n-type wafers with p-type emitters will require innovative surface passivation schemes. The above-mentioned drawbacks of current approaches make it difficult to use either as-deposited $SiN_x$ or $Al_2O_3$ films for anti-reflection coatings on all types (n-doped or p-doped) of surfaces.

Therefore, given these and other shortcomings, there is a need for a reliable and easy method to manipulate the amount and polarity of the net charge present in a dielectric, where manipulating the net charge allows application of the dielectric film to both n-doped as well as p-doped surfaces.

SUMMARY OF THE INVENTION

The present invention overcomes the aforementioned drawbacks by providing a method for making a solar cell. The method includes providing a stack including a substrate, a barrier layer disposed on the substrate, and an anti-reflective layer disposed on the barrier layer, where the anti-reflective layer has charge centers. The method further includes generating a corona with a charging tool and contacting the anti-reflective layer with the corona, thereby injecting charge into at least some of the charge centers in the anti-reflective layer. The thickness of the barrier layer is sufficient to prevent electron tunneling from the substrate to the anti-reflective layer.

In another embodiment, the method includes providing a stack including a substrate, a barrier layer disposed on the substrate, and an anti-reflective layer disposed on the barrier layer, where the anti-reflective layer has charge centers. The method further includes generating a corona with a negative charging tool and contacting the anti-reflective layer with the corona, thereby injecting negative charge into at least some of the charge centers in the anti-reflective layer.

In yet another embodiment, the method includes providing a stack including a substrate, a barrier layer disposed on the substrate, and an anti-reflective layer disposed on the barrier layer, where the anti-reflective layer has charge centers. The method further includes generating a corona with a bipolar charging tool and contacting the anti-reflective layer with the corona, thereby injecting positive or negative charge into at least some of the charge centers in the anti-reflective layer.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
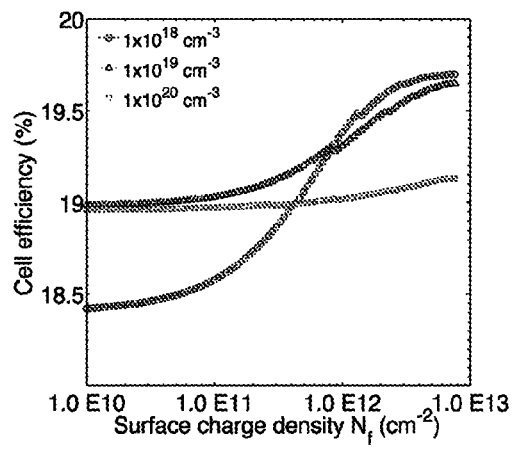
FIG. 1 is a graph illustrating cell efficiency versus positive fixed charge applied to the front surface of an n-type emitter of a typical industrial $n^+$-p silicon solar cell for three different doping concentrations.

As crystalline silicon solar cells continue to get thinner, surfaces play an ever important role in controlling efficiency. An approach to minimizing efficiency losses implements field effect passivation, whereby charges present in dielectric films deposited on cell surfaces enable the reflection of minority charge carriers and thus reduce surface recombination. The most widely used dielectric anti-reflection coating for silicon cells is silicon nitride ($SiN_x$). As-deposited, $SiN_x$ thin films are known to carry net positive charges, originating from specific silicon nitrogen dangling bonds (●$SiN_3$) known as K centers. Although positive charges are beneficial for the passivation of cells containing n-type emitters, they may not be desirable for passivation of the rear p-base of such cells due to the formation of an inversion layer between the metal contacts that leads to shunting and thus reduces cell efficiency. In addition, cells with p-type emitters would benefit from passivation by a dielectric film containing negative charges.

This invention implements changes to enable the silicon nitride charge to be manipulated as desired. For example:
(1) The anti-reflection coating is changed from plasma enhanced chemical vapor deposition (PECVD) silicon nitride to a layered structure with a thin layer of PECVD silicon dioxide between the silicon nitride and the surface of the silicon. The silicon dioxide serves to prevent charge injection from or to the substrate, allowing the nitride to retain the stored charge over time, but still allows the chemical passivation benefits from the hydrogen in the silicon nitride to occur. Thicknesses of a few nanometers are adequate and it is readily deposited in the same PECVD tool sequentially with the silicon nitride.
(2) The cell can be processed in the normal fashion through all high temperature steps, including the firing of the front and back metal interconnects and contacts, so that the charge distribution in the K-centers reaches equilibrium and no further high temperature steps are to be done.
(3) The solar cell is scanned beneath a corona discharge sustained on a small radius wire held parallel to and just above the wafer surface. This can be done in a separate tool, or it could be built in to the exit region of the belt furnace which does the metal firing. The polarity of the voltage applied to the wire electrode determines the sign of the charge that will be induced in the nitride. One or more wires can be arrayed in parallel if necessary, but time studies have shown that the charging occurs in seconds such that throughput will not be an issue.

In one embodiment of the invention, there is provided a method for making a solar cell. The method uses a stack including a substrate, a barrier layer disposed on the substrate, and an anti-reflective layer disposed on the barrier layer wherein the anti-reflective layer has charge centers. A corona is generated with a charging tool; and the anti-reflective layer is contacted with the corona thereby injecting charge into at least some of the charge centers in the anti-reflective layer. The thickness of the barrier layer is sufficient to prevent electron tunneling from the substrate to the anti-reflective layer. In one version of the method, a silicon substrate is used, a silicon dioxide barrier layer is formed on the substrate, and a silicon nitride anti-reflective layer is formed on the barrier layer. Forming the barrier layer can be performed at a temperature in the range of 100° C. to 400° C. The charge centers can be amphoteric. The charge centers can be dangling bonds. A symmetrical stack can also be used wherein a first anti-reflective layer and a first barrier layer are disposed on a first side of the substrate and a second anti-reflective layer and a second barrier layer are disposed on an opposite second side of the substrate.

In one version of the method, the corona is generated with a negative polarity charging tool, and the anti-reflective layer is contacted with the corona thereby injecting negative charge into at least some of the charge centers in the anti-reflective layer.

In one version of the method, the corona is generated with a bipolar charging tool, and the anti-reflective layer is contacted with the corona thereby injecting positive or negative charge into at least some of the charge centers in the anti-reflective layer.

In one version of the method, the substrate comprises a doped semiconductor material. The substrate may comprise a p-doped silicon material. The substrate may comprise an n-doped silicon material. In one form, the substrate is of a thickness in the range of 100 nanometers to 1000 nanometers. In one form, the substrate is of a thickness in the range of 200 nanometers to 500 nanometers. In one form, the substrate is of a thickness in the range of 300 nanometers to 400 nanometers.

The barrier layer may comprise a dielectric material. The barrier layer may comprise silicon dioxide. In one form, the barrier layer is of a thickness in the range of 15 nanometers to 50 nanometers. In one form, the barrier layer is of a thickness in the range of 25 nanometers to 50 nanometers. In one form, the barrier layer is of a thickness in the range of 15 nanometers to 25 nanometers.

In one version of the method, the anti-reflective layer comprises silicon nitride. The anti-reflective layer may be of a thickness in the range of 10 nanometers to 500 nanometers. The anti-reflective layer may be of a thickness in the range of 25 nanometers to 200 nanometers. The anti-reflective layer may be of a thickness in the range of 50 nanometers to 100 nanometers.

In one version of the method, the charging tool comprises a wire assembly configured to receive a voltage for generating the corona. The wire assembly may comprise at least one wire having a diameter in the range of 100 micrometers to 1000 micrometers. The wire assembly can be dimensioned such that a longitudinal length of the generated corona contacting the anti-reflective layer is 50% to 100% of a largest longitudinal dimension of the anti-reflective layer. The wire assembly can be dimensioned such that a longitudinal length of the generated corona contacting the anti-reflective layer is greater than 100% of a largest longitudinal dimension of the anti-reflective layer. The operating voltage can be as high as +/−25,000 V, while a preferred operating voltage is usually 5 k-10 k V.

In one version of the method, the anti-reflective layer is exposed to ultraviolet radiation. The ultraviolet radiation may have a wavelength of 300 nanometers or less.

Disclosed herein is a method to directly control and permanently modify the net charges in dielectric anti-reflection thin films using a bipolar corona discharge process. Specific examples are provided below, wherein the properties of as-deposited and modified $SiN_x$ thin films are described. These examples are offered for illustrative purposes only, and are not intended to limit the scope of the present invention in any way. Indeed, various modifications of the invention in addition to those shown and described herein will become apparent to those skilled in the art from the foregoing description and the following example and fall within the scope of the appended claims. For example, specific examples of substrates, emitter types and doping levels are provided, although it will be appreciated that other substrates, emitter types and doping levels may also be used. Likewise, process parameters and steps are recited (for example, doping, thickness, energy, means and conditions of pre and post-processing, and so forth) that may be altered or varied based on variables such as time, temperature, pressure, voltage, wavelength, power, geometrical factors and dimensions, materials, and so forth.

Example I

The silicon nitride thin films examined were representative of typical industry standard films, and were deposited in a 13.56 MHz Applied Materials PECVD tool at the Solar Power Lab at Arizona State University (ASU). The films were 76-80 nm thick with a refractive index of 2.01, measured using a JA Woollam ellipsometer. Capacitance-voltage (C-V) measurements were performed to determine the polarity and quantify the amount of charge present in the $SiN_x$ films. A custom-built corona charging tool, comprising a small-diameter copper wire held about 1 inch above the substrate and connected to a positive or a negative power supply capable of voltages up to 20,000V, was used to inject positive or negative charges in the $SiN_x$ film. A high energy ultra-violet (UV) light, and various heat treatments, were then used to neutralize and control the magnitude of the charges. Electron spin resonance (ESR) measurements were taken at the ESR facility at ASU on standard $SiN_x$ films deposited on silicon substrates to detect the paramagnetic defects in the film. All the ESR spectra were taken at room temperature using a Bruker ELEXSYS 580 X-band spectrometer.

Effect of Magnitude and Polarity of Fixed Surface Charges on Cell Efficiency: PC1D Simulation Using a PC1D simulator that computes quasi-one-dimensional transport of electrons and holes in photovoltaic devices, simulations were performed to quantify the effect of magnitude and polarity of surface charges on the efficiency of a typical industry standard n⁺-p cell. The simulated device structure was a 180 μm thick, p-type ($N_A$=5×10$^{15}$ cm$^{-3}$) cell with three different n-type emitter ($N_D$) doping levels of 1×10$^{18}$ cm$^{-3}$, 1×10$^{19}$ cm$^{-3}$, and 1×10$^{20}$ cm$^{-3}$. By varying emitter doping levels, the effect of charge on cell architectures with higher sheet resistances (100-120 Ω/square) was assessed. Positive as well as negative surface charge was applied to front and back surfaces. Bulk lifetime was fixed at 500 μs and front and rear surface recombination velocities were fixed at 10000 cm/s. No back surface field (BSF) region was selected in order to evaluate the influence of positive surface charges applied on the rear p-doped surfaces on cell efficiencies.

FIG. 1 illustrates the effect of positive fixed charge density ($N_f$) on cell efficiencies when applied to the front surface of an n⁺-p cell for three emitter ($N_D$) doping levels. As shown, the cell efficiencies increase when the amount of positive fixed charge increases from 1×10$^{19}$ cm$^{-2}$ to 1×10$^{13}$ cm$^{-2}$. A higher magnitude of positive charge applied to the n-type surface creates a strong accumulation layer that effectively shields the minority holes from approaching the damaged surfaces, thereby minimizing the surface recombination and increasing the cell efficiency. The charges are most effective in creating a strong accumulation layer for a lightly doped emitter (1×10$^{18}$ cm$^{-3}$) compared to a heavily doped emitter (1×10$^{20}$ cm$^{-3}$).

Figure 2:
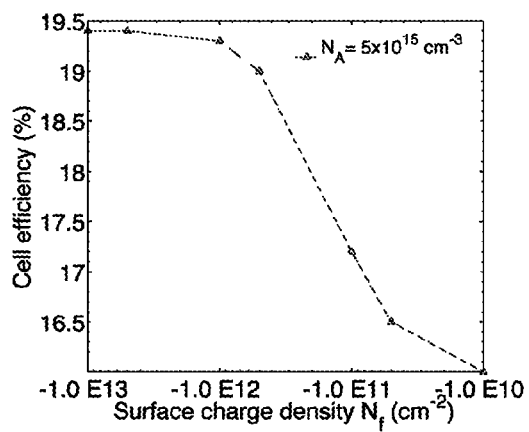
FIG. 2 is a graph illustrating cell efficiency versus negative fixed charge applied to the rear p-type base surface of a typical industrial n+-p silicon solar cell.

When negative charges are applied to the rear p-type surface of the cell, a rise in cell efficiency is observed with increasing magnitude of negative surface charges, as shown in FIG. 2. Negative charges are able to create a strong hole accumulation layer that keeps minority electrons away from the rear surfaces and minimizes rear surface recombination. Therefore, the simulations show that surface charges (positive or negative) greater in magnitude than about 5×10$^{11}$ cm$^{-2}$ are required to achieve higher cell efficiencies. As future cell architectures may predominantly consist of lightly doped emitters, requiring rear dielectric passivation schemes and thinner substrates, implementing charge-assisted passivation techniques may provide the requisite advantageous features to boosting cell efficiencies.

Manipulation of Charges in the Silicon Nitride Films: Capacitance-Voltage Study

Test samples were fabricated using boron doped (1-5 Ω cm) p-type CZ silicon, 675 μm thick, prime grade, single side polished substrates, by following a process of cleaning, oxidation, anneal in forming gas, deposition and subsequently charge injection. Cleaning involved dipping the Si substrates in a standard RCA B solution at 75° C. for 10 minutes, followed by a 10 minute rinse in DI water and a drying step in a spin rinse dryer tool. For these test samples, oxidation was achieved by a thermal growth of a thin oxide layer (~18 nm) on the cleaned silicon substrates in a furnace at 950° C. for 20 minutes. The oxide layer acted as a barrier, blocking the movement of charge between the silicon substrate and the $SiN_x$ film. Subsequently, a forming gas anneal step was implemented with a $N_2/H_2$ gas at 400° C. for 20 minutes to minimize the defects in the thermal oxide layer. $SiN_x$ films of thicknesses 78-80 nm on top of the thin oxide layer were deposited using an Applied Materials AMAT P5000 PECVD tool. A custom-built corona charging tool was subsequently used to inject charge into the as-deposited nitride films. On account of the thickness of the oxide layer between the nitride film and the heavily doped p-type substrate preventing charge tunneling from the substrate, the source of negative or positive charges injected into the $SiN_x$ film likely originated from the ions generated by the corona discharge of air.

Specific silicon nitrogen dangling bonds ($.SiN_3$), known as K centers or Charge centers, are known to be the primary charge trapping defects present in as-grown $SiN_x$ films. (see FIG. 10) These defects exist in three different charged states, namely neutral $K^0$ (with one electron), 103, positively charged $K^+$ (with no electron) 105, and negatively charged $K^-$ defect (with two spins of electron). 107,The K center defects act as amphoteric defects that can trap either an electron or a hole and change their charge state according to the following equations:

 (1)

 (2)

As shown in Eqn. (1), the neutral $K^0$ defect present in the nitride film captures an electron during negative corona charging and converts to negatively charged $K^-$ defect with two electrons. Similarly, following positive corona charging, the neutral $K^0$ defect changes to positively charged $K^+$ defect after donating its electron or capturing a hole as described by Eqn. (2).

Figure 3:
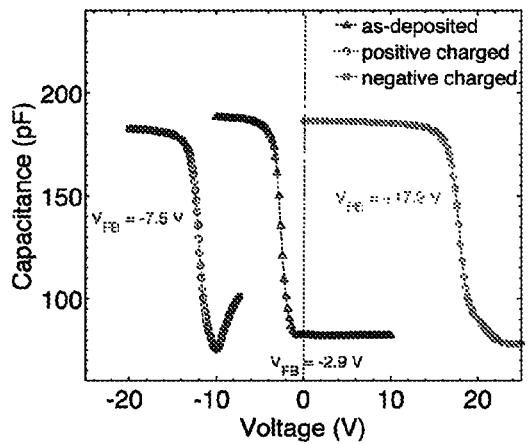
FIG. 3 is a graph illustrating the capacitance versus voltage measurements for an as-deposited, positively and negatively charged silicon nitride film.

Shown in FIG. 3 are C-V measurements taken using a Hg probe that compare as-deposited and charge-injected $SiN_x$ films. The as-grown film displayed a flat-band voltage VFB of −2.9 V indicative of the presence of net positive charges ($N_f$) of $3.3 \times 10^{11}$ cm$^{-2}$. To observe the effect of charging directly, the same sample was then divided in two, with each piece subsequently receiving a positive and negative charge injection, respectively. The sample treated with positive charge injection displayed a $V_{FB}$ of −7.5 V, equivalent to a POSITIVE charge in the film on the order of $4.6 \times 10^{12}$ cm$^{-2}$. Similarly, the sample treated with negative charge injection, displayed a VFB of +17.1 V, indicative of a NEGATIVE charge on the order of $-6.9 \times 10^{12}$ cm$^{-2}$. A comparison of flat-band voltage and fixed charge density is illustrated in Table I between as-deposited, positive and negatively charged films. The achieved positive or negative charges show that either polarity can be injected in the same as-grown nitride film, as desired, demonstrating that a $SiN_x$ may be utilized on both p, as well as n-type, surfaces for the purpose of field effect passivation.

In addition, the efficiency of the charging process was investigated by measuring the time dependence of corona charging on the $SiN_x$ films. To do so, as-grown samples, of 78 nm thickness, were taken from the same wafer and subjected to corona discharge for varying time durations. C-V measurements then identified the sign and magnitude of charge injected charge. Using a negative charge polarity on $SiN_x$ film samples, the injected charge reached its maximum shortly after 30 seconds of exposure time, indicating that the amount of injected charge is generally independent of exposure time and maximum charge can be achieved quickly.

TABLE I

EFFECT OF CORONA CHARGING ON SILICON NITRIDE FILM CHARGES

| Test # | Condition | Flat band voltage ($V_{FB}$) (V) | Fixed charge density ($N_f$) (cm$^{-2}$) |
|---|---|---|---|
| 1 | As-deposited | −2.9 | $+3.3 \times 10^{11}$ |
| 2 | After positive corona charging | −7.5 | $+4.6 \times 10^{12}$ |
| 3 | After negative corona charging | +17.1 | $-6.9 \times 10^{12}$ |

Figure 4:
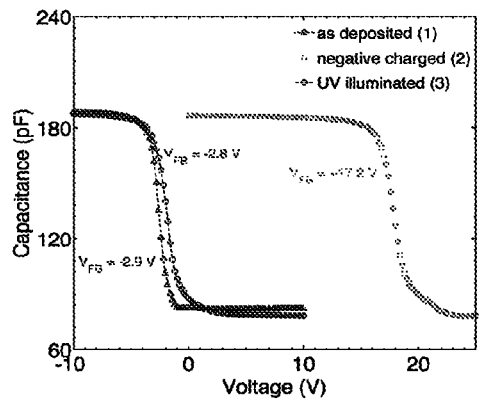
FIG. 4 is a graph illustrating the capacitance versus voltage measurements for an as-deposited, negatively charged and ultra-violet (UV) illuminated silicon nitride film.

To examine the effects of ultraviolet illumination, a negatively charged $SiN_x$ sample was illuminated with a high energy (sub-300 nm) UV light and re-measured using the C-V technique. The results are illustrated in FIG. 4 and summarized in Table II, wherein the C-V characteristics of as-deposited $SiN_x$ are compared to the negatively charged $SiN_x$ before and after UV illumination. It was observed that all injected negative charges were neutralized after the UV illumination and the measured charge was equal to the original as-deposited amount. The injected charge was neutralized by sub-band gap UV absorption, whereby the UV radiation simply re-arranged the spins on the K centers and converted the negatively charge $K^-$ centers back to the neutral $K^0$ centers through a process known as photo-bleaching. Of note is that the total population of the K center defects originating from bonds (●$SiN_3$) in the silicon nitride remained constant, and only the percentages of individual charged states ($K^+$, $K^0$ or $K^-$) were changed by charge injection or UV illumination.

TABLE II

Effect Of Corona Charging And UV Illumination On Silicon Nitride Film Charges

| Test # | Condition | Flat band voltage ($V_{FB}$) (V) | Fixed charge density ($N_f$) (cm$^{-2}$) |
|---|---|---|---|
| 1 | As-deposited | −2.9 | $+3.3 \times 10^{11}$ |
| 2 | After negative corona charging | +17.1 | $-6.9 \times 10^{12}$ |
| 3 | After UV illumination | −2.8 | $+3.3 \times 10^{11}$ |

Figure 5:
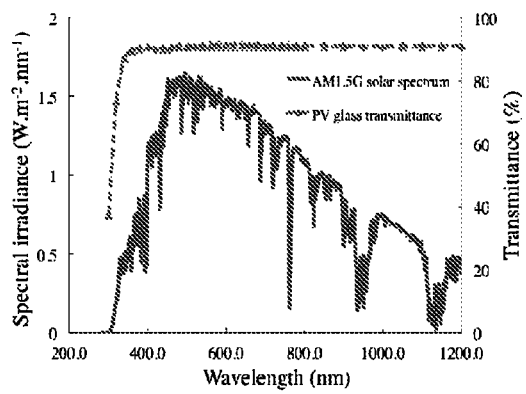
FIG. 5 is a graph illustrating the AM1.5G solar spectrum and the transmittance spectrum of a standard 3.2 mm-thick photovoltaic glass.

Although sub-300 nm UV radiation can achieve charge neutralization in charged $SiN_x$ films, solar cells operate under AM1.5G solar radiation, which does not contain photons in this energy range. This is illustrated in FIG. 5, wherein AM1.5G solar radiation is shown to exhibit no appreciable spectrum below about 300 nm. Furthermore, solar cells typically include standard 3.2 nm thick PV glass placed over the cell modules. The glass does not transmit any solar radiation below 300 nm, as shown in FIG. 5. Therefore, once the desired amount of charge is injected into the nitride film, it may remain indefinitely under solar irradiation. Consequently, the ability to manipulate and neutralize the charge in $SiN_x$ film, as desired, is of great technological importance for the solar cell applications.

Detection of Paramagnetic K Center Defects in Silicon Nitride Films: ESR Study

C-V measurements can only quantify the net difference between the positive and negative charges present in the nitride film originating from the respective $K^+$ and $K^-$ defects. On the other hand, an electron spin resonance (ESR) technique can detect the presence of neutral $K^0$ defects in the nitride films, which are paramagnetic due to the presence of one electron on the (●$SiN_3$) bond. The spin density (spins/cm$^2$) present in nitride film samples quantifies an approximate number of neutral paramagnetic $K^0$ defects. As such, ESR was used to investigate the properties of K centers in the nitride film.

Figure 6:
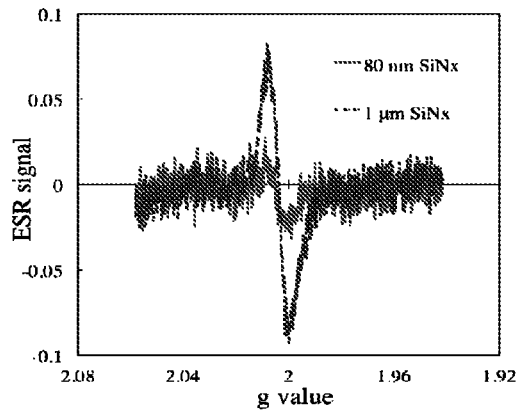
FIG. 6 is a graph illustrating electron spin resonance (ESR) measurements on an 80 nanometer and 1 micrometer thick silicon nitride film.

FIG. 6 shows ESR measurements performed on $SiN_x$ film samples with different thicknesses, namely 80 nm and 1 μm. A higher peak-to-peak ESR signal amplitude was observed for the 1 μm-thick film compared to the 80 nm-thick one. Based on a $MnCl_2$ solution calibration standard with a known spin density, the spin densities for the 1 μm and 80 nm-thick nitride films were determined to be $1.24\times10^{13}$ spins/cm$^2$ and $1.2\times10^{12}$ spins/cm$^2$, respectively, indicating that more neutral paramagnetic $K^0$ defects are present in thicker films. Therefore, the presence of a larger magnitude of $K^0$ defects in thicker films point to the fact that neutral $K^0$ defects are spread throughout the bulk of nitride films.

Effect of High Temperature Annealing of K Center Density: ESR Study

Silicon nitride films, typically grown by a method known as plasma enhanced chemical vapor deposition (PECVD), are usually subjected to high temperature processing steps, such as forming gas annealing (FGA) or the belt furnace firing to contact formation. Therefore, the effects of high temperature annealing on the density of K centers in the nitride films were investigated. For this, a 6-inch round silicon substrate topped with 1 μm thick PECVD-grown silicon nitride on both sides, was cleaved to obtain four samples that were subsequently subjected to various temperature treatments. These included (A) a control sample with no heat treatment, (B) a sample undergoing FGA treatment (400° C. for 20 min), (C) a sample undergoing a $N_2$ anneal (400° C. for 20 min) and (D) a sample undergoing a belt furnace treatment (835° C. for 1 min).

TABLE III

Effect of High temperature annealing on the spin densities of Silicon nitride films

| Sample | Condition | Spin density (Spins/cm$^2$) | Change versus control (%) |
|---|---|---|---|
| A | As-deposited | $+5.1 \times 10^{13}$ | — |
| B | FGA | $+1.7 \times 10^{13}$ | -66% |
| C | $N_2$ annealed | $+3.1 \times 10^{13}$ | -40% |
| D | Belt furnace fired | $+4.6 \times 10^{13}$ | -9% |

Figure 7:
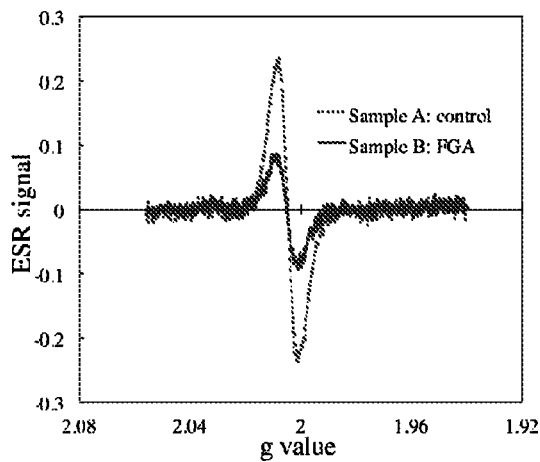
FIG. 7 is a graph illustrating ESR measurements on a 1 micrometer silicon nitride film (deposited on both sides of a Si substrate), showing the effect of high temperature annealing on the density of paramagnetic K centers.

FIG. 7 illustrates ESR measurements of sample (B) versus the control (A), indicative of a reduction in the ESR signal with a high temperature treatment, wherein the spin density of $1.7\times10^{13}$ spins/cm$^2$ measured for sample (B) was approximately 66% less than that of the control. The significant drop in spin density may be attributed to the passivation of K centers by hydrogen in the FGA process. As summarized in Table III, all annealed samples (B), (C) and (D) showed a marked decrease in the magnitude of ESR signal and spin density compared to the control sample (A).

Effect of Charge Manipulation on Minority Carrier Lifetime:

Photoconductance and Photoluminescence Measurements

To measure the effect of charge of either polarity on the minority carrier lifetime, photoconductance measurements were performed on nitride film test structures. The structures consisted of p-type, 480 μm FZ Si substrates with 80 nm thick PECVD silicon nitride and 20 nm thick PECVD silicon oxide film deposited on both sides at 200° C. The carrier lifetime was measured using Sinton WCT 120 lifetime tester at a specified carrier density of $1\times10^{15}$ cm$^{-3}$. Photoluminescence measurements were also performed on the same samples after charge injection to further confirm the effect of injected charge on surface conditions.

Figure 8:
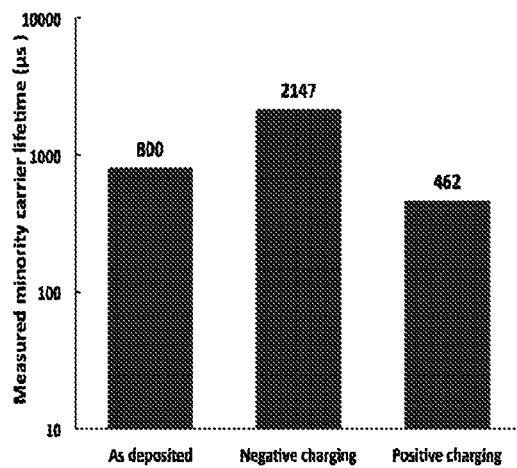
FIG. 8 is a graph illustrating minority carrier lifetime measurements taken on a p-type FZ Si substrate after depositing silicon nitride, with subsequent negative and positive charging, respectively.

As shown in FIG. 8, the as-deposited silicon nitride sample exhibited a minority carrier lifetime of 800 μs. However, when negative charges were injected in the nitride film, the minority carrier lifetime significantly increased to 2147 μs, implying an effective surface recombination velocity ($S_{eff}$) of approximately 11 cm/s. The same sample was then subjected to positive charge injection and the minority carrier lifetime degraded to down to 462 μs, with a $S_{eff}$ value of 51 cm/s. The improvement and deterioration of minority carrier lifetime following charge injection is due to accumulation and depletion of surfaces respectively with respect to surface charges.

Figure 9:
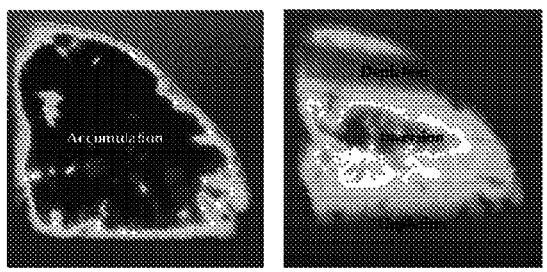
FIG. 9 is an illustrative example of photoluminescence images of a silicon substrate taken after negative (left) and positive charging (right) of the silicon nitride film.

Photoluminescence images of the same samples with negative and positive charge injection are shown in FIG. 9, providing confirmation of the photoconductance measurement results. When negative charges were injected in the nitride film, the surfaces were accumulated with majority holes present in the p-type FZ silicon sample and the $S_{eff}$ decreased due to significant decrease in surface recombination. On the other hand, injecting positive charges in the same nitride film sample led to depletion and weak inversion conditions at the surfaces that increased the surface recombination. Changing the net polarity of the fixed charge in the nitride film changed the surface conditions from accumulation to depletion/inversion that further led to changes in surface passivation. Therefore, these results demonstrate that the net charge present in the $SiN_x$ films can be manipulated to either polarity and their effect on surface passivation can then be measured using photoconductance and photoluminescence techniques.

In summary, the properties of fixed positive charges present in as-deposited and modified $SiN_x$ films were studied by capacitance voltage (CV) and electron spin resonance (ESR) techniques. ESR results showed that the neutral, paramagnetic $K^0$ defects are distributed throughout the bulk of the nitride film. The present invention illustrates that as-deposited $SiN_x$ films carrying the neutral defects ($K^0$ centers) may be manipulated to either positive ($K^+$) or negative ($K^-$) charge states, and thus be able to minimize surface recombination depending on the end application. Corona charging was used to change the net charge in the films to either positive or negative and high energy (sub-300 nm) UV light was used to neutralize or annihilate the charges. It was also demonstrated that high temperature annealing decreases the amount of neutral defects possibly due to bonding of hydrogen with the K center. Additionally, first order effects of both positive and negative nitride charges on test structures were studied by photoconductance measurements. As such, the ability to manipulate the net charge of the $SiN_x$ film to either positive or negative allows the nitride film to be applied to both n and p-doped surfaces, and thus significantly overcoming current technological challenges.

Example II

Sample Fabrication

Figure 10:
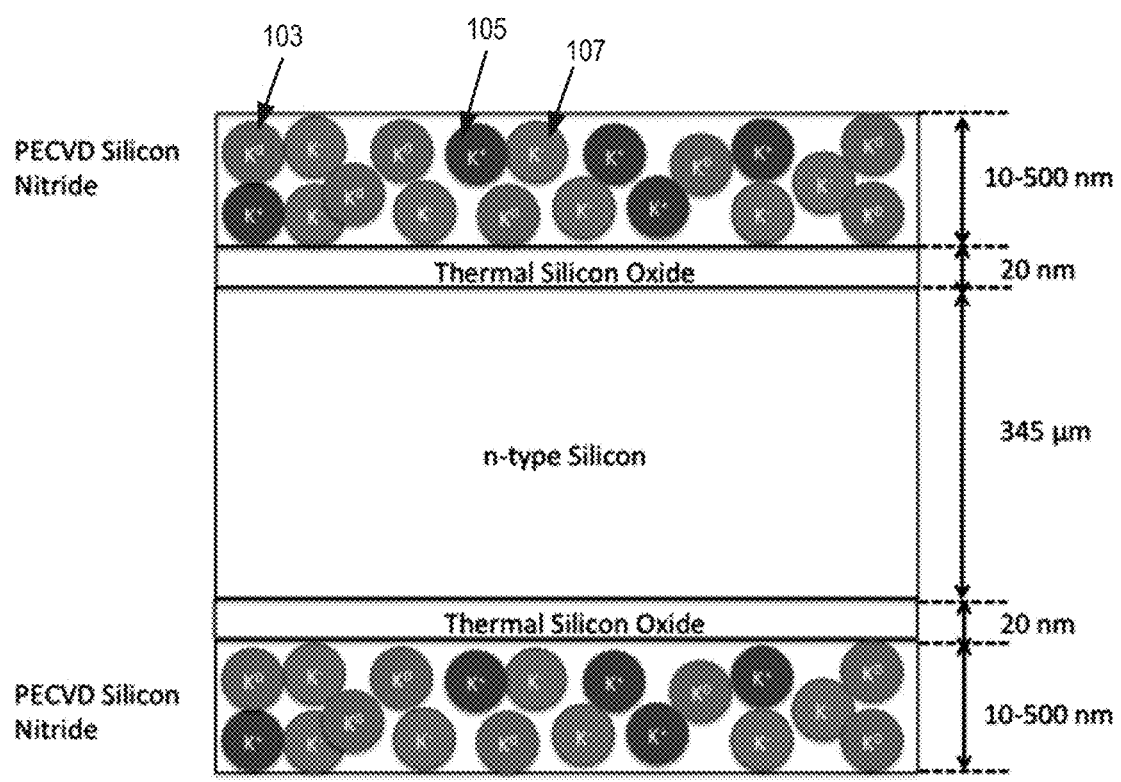
FIG. 10 is a schematic diagram of a symmetrical $Si/SiO_2/SiN_x$ stack used in Example II below.

Samples used in this example were prepared at Arizona State University (ASU) Solar Power Lab. The wafers used were 3-inch Czochralski (CZ) grown n-type (phosphorus doped) silicon substrate with a <100> surface crystal orientation. They were double-side polished with resistivity of 1-10 Ω-cm ($\sim 1\times10^{15}$ cm$^{-3}$). Symmetrical Si/SiO2/SiNx stacks were developed as shown in FIG. 10.

Fabrication procedure of this example device is shown in Table 3.1. Wet chemical cleaning with three solutions was the first procedure and it is an important way of chemical passivation of Si surface. Piranha solution is a mixture of sulfuric acid ($H_2SO_4$) and hydrogen peroxide ($H_2O_2$) with a ratio of 4:1. The purpose of piranha etch is to remove organic residues off the wafers. RCA is short for a company name "Radio Corporation of America". RCA-B solution is a mixture of deionized water, hydrochloric acid (HCl) and hydrogen peroxide ($H_2O_2$) with a ratio of 5:1:1. The purpose of RCA-B clean is to eliminate metallic (ionic) contamination. BOE is the abbreviation for buffered oxide etch, which is used to remove silicon oxide.

TABLE 3.1

Fabrication procedure of the charged symmetrical $Si/SiO_2/SiN_x$ stack of Example II.

| Order | Procedure | Details |
|---|---|---|
| 1 | Cleaning | 10 min Piranha, 10 min RCA-B, 2 min BOE |
| 2 | Thermal oxidation | 1100° C. Dry oxidation, 20 nm film |
| 3 | FGA | 400° C. |
| 4 | PECVD $SiN_x$ deposition | 200° C., 10-500 nm film |
| 5 | FGA | 400° C. |
| 6 | Corona charging | 1 min |

After wafer cleaning, $SiO_2$ films were grown on both sides by dry thermal oxidation. The dangling bonds at Si surface were well passivated by $SiO_2$. Samples were then annealed by forming gas to reduce $Si/SiO_2$ interface states and oxide trapped charges in the films. $SiN_x$ films were deposited on the top of $SiO_2$ films by PECVD, and the thickness of $SiN_x$ films is shown in Table 3.2. After another FGA run, charges with either polarity were injected into $SiN_x$ films by corona charging technique.

TABLE 3.2

Thickness of silicon nitride film of samples used in Example II.

| | Lot | | | | | |
|---|---|---|---|---|---|---|
| | DI0188 | | | DI0206 | | |
| Wafer | 01 | 02 | 03 | 02 | 03 | 04 |
| Thickness (nm) | 90 | 178 | 460 | 10 | 20 | 40 |

Corona Charging

Figure 11:
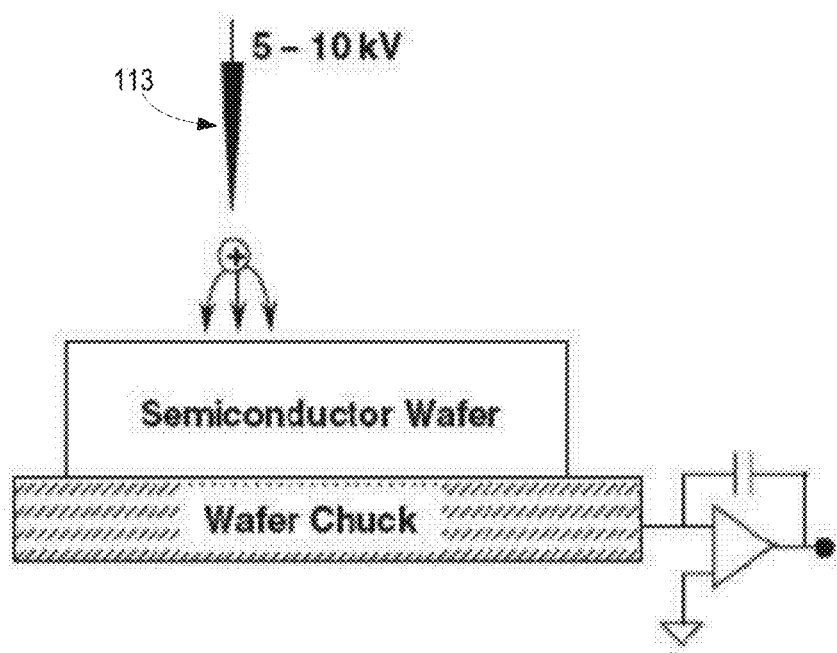
FIG. 11 is a cross-section schematic of the corona charging technique used in Example II.

Charge injection in the $SiN_x$ film is performed by corona charging technique. A custom-built corona discharge tool is used for the charging experiments. The schematic illustration of the corona charging technique for injecting charge into at least some of the charge centers is shown in FIG. 11. A copper wire is used as an electrode 113 and the wafer chuck is grounded. The high voltage applied in the electrode 113 can be as high as +/−25,000 V, while the operating voltage is usually 5 k-10 k V. For the positive applied voltage, positive corona ions (mainly $H_3O^+$, hydrated protons) are generated and repelled to the surface of $SiN_x$ film due to the electric field between the electrode 113 and chuck. Similarly, for the negative voltage, negative corona ions (mostly $CO_3-$) are generated and repelled to the film surface. Depending on the polarity and time of the applied voltage, the charge polarity and density in the $SiN_x$ film can be changed via K centers.

Figure 12:
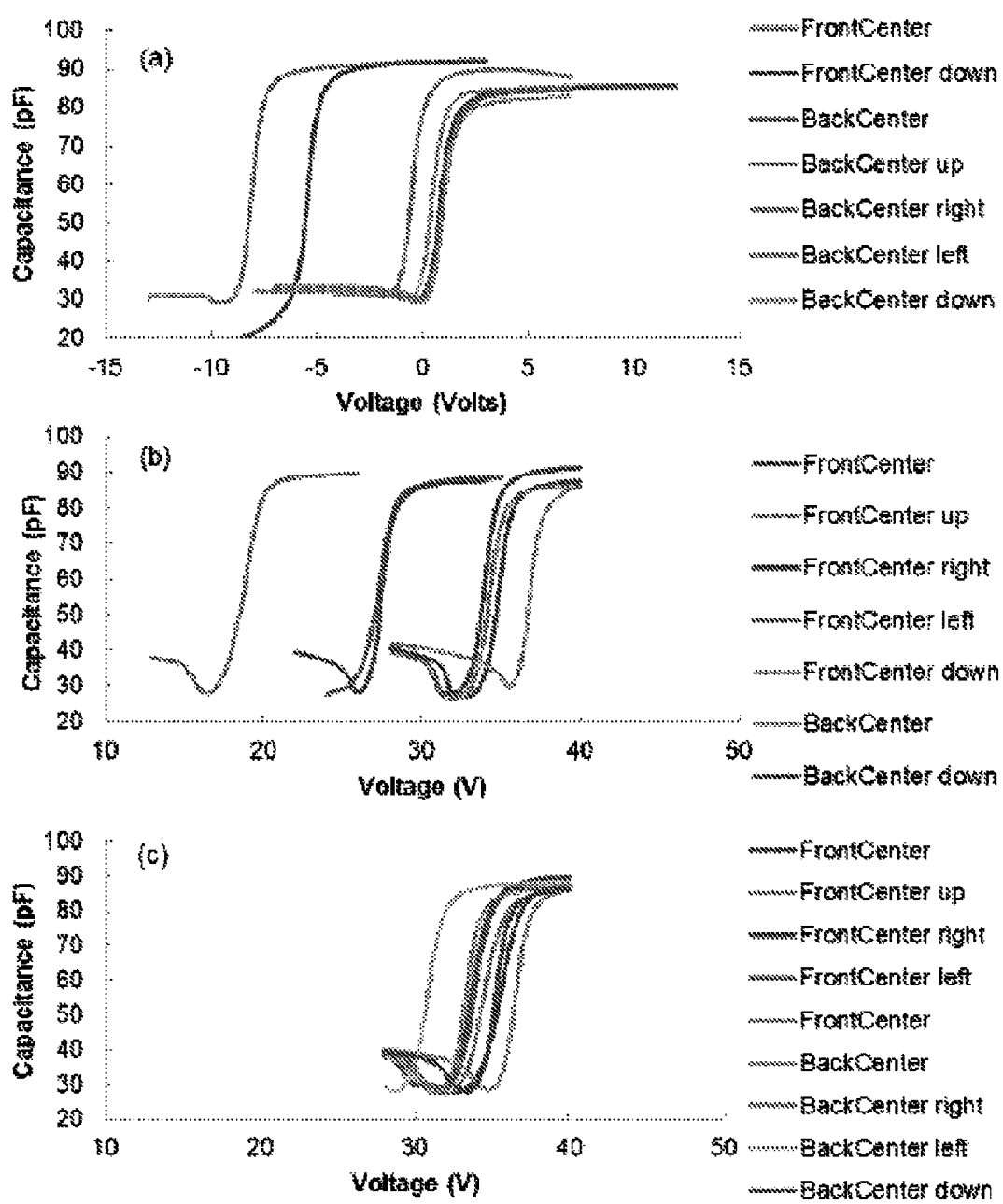
FIG. 12 show capacitance voltage (CV) curves of wafer DI0188-02 of Example II during processes: (a) after forming gas annealing (FGA), (b) after 1st negative charging, and (c) after 2nd negative charging. Measurements are performed at the center and off the center by 5 mm on both sides.

The corona charging tool of this example did not have a moving chuck or electrode so the wafer had to be moved manually. To obtain the uniformity of charges, five-point capacitance-voltage (CV) measurements around the center of samples were performed before and after negative charging. The charging procedure contains two parts: 1st charging was 30s' charging at the top then move the wafer towards the bottom with an interval of 1 cm; 2nd charging was also 30 s' charging but move from left to right with an interval of 1 cm. According to CV curves in FIG. 12, negative charges were injected into the $SiN_x$ film after the 1st charging, but with a poor uniformity (26% non-uniformity). After 2nd charging, charge distribution was more uniform (7% non-uniformity). Charges are mostly saturated in the $SiN_x$ film with an average density of $-4.2 \times 10^{12}$ cm$^{-2}$ after 2nd charging, because the maximum flat-band shift is about the same level with that after 1st charging. Therefore one appropriate charging procedure was developed as: 30 s charging and moving the wafer with an interval of 1 cm from top to bottom then from left to right.

Lifetime Improvement

Photoconductance lifetime measurement is extensively used for c-Si solar cells. In this example, the lifetime is measured by a Sinton Instruments WCT-120 photoconductance lifetime tester, abbreviated as 'lifetime tester'. The measured minority carrier lifetime is commonly referred to as the effective lifetime ($\tau_{eff}$), which is determined by bulk recombination and surface recombination.

During the measurement, the lifetime tester measures the conductivity (σ) of the wafer from RF coils. The relationship between conductivity and carrier density is given by $$\sigma = q(n\mu_e + p\mu_h) \quad (3.3)$$

where $\mu_e$ and $\mu_h$ are electron and hole mobilities, and either is a function of carrier concentration and temperature.

A flash of light is produced from a xenon lamp and passes a 700 nm wavelength infrared (IR) pass filter, generating uniform excess carriers across the wafer. The excess carrier concentration can then be calculated from the difference of measured conductivity after and before flash exposure. The light intensity and generation rate (G) are obtained from a reference solar cell.

There are two analysis methods for different situations: (a) quasi-steady-state photoconductance (QSSPC) decay method; and (b) transient photoconductance decay (PCD) method. QSSPC aims to measure a relatively low lifetime (<200 μs for this lifetime tester) using a long flash exposure time (1 s). In this case, the carrier concentrations are essentially in steady-state, which means the recombination rate (U) and generation rate (G) of carriers are equal. The effective lifetime is then expressed as $$\tau_{eff} = \frac{\Delta n}{G} \quad (3.4)$$

The transient PCD method aims to measure a relatively high lifetime (>200 μs for this lifetime tester) using a short flash exposure time (1/64 s). In this case, the excess carrier concentrations are not steady, and show an exponential decay with respect to time with the decay time constant ($\tau_{eff}$). The expression is given by $$\tau_{\mathit{eff}} = \frac{\Delta n}{\frac{dn}{dt}} \quad (3.5)$$

A generalized analysis by recombining the QSSPC and PCD method was proposed by Nagel et al ["Generalized analysis of quasi-steady-state and quasi-transient measurements of carrier lifetimes in semiconductors," *Journal of Applied Physics*, vol. 86, no. 11, pp. 6218-6221, 1999]. The expression in this case is $$\tau_{\mathit{eff}} = \frac{\Delta n}{G - \frac{dn}{dt}} \quad (3.6)$$

Figure 13:
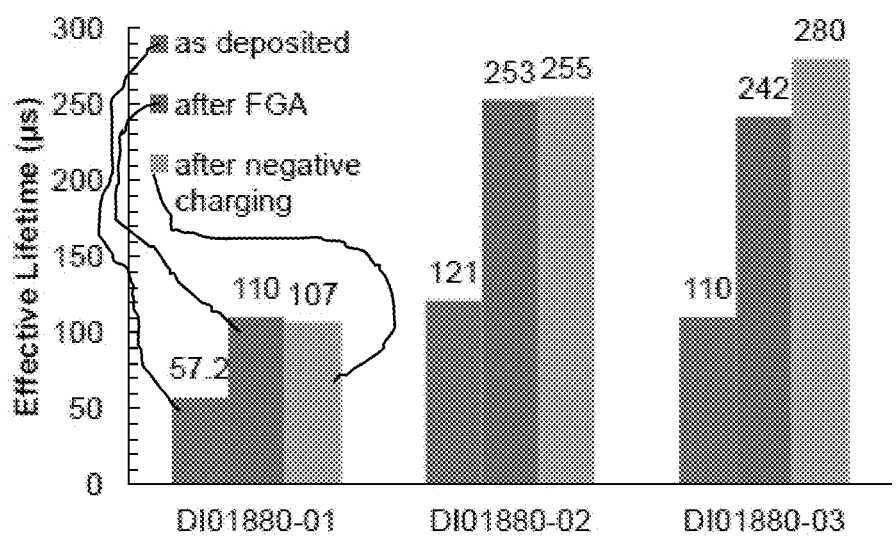
FIG. 13 is a graph illustrating the effect of forming gas annealing (FGA) and negative charges on effective lifetime for symmetrical $Si/SiO_2/SiN_x$ stacks in lot DI0188 of Example II.
Figure 14:
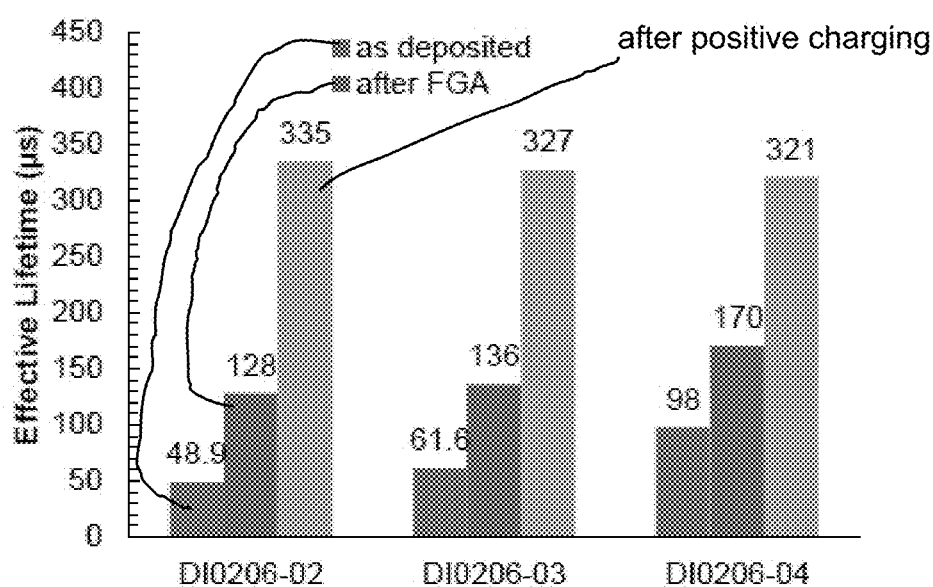
FIG. 14 is a graph illustrating the effect of forming gas annealing (FGA) and positive charges on effective lifetime of symmetrical $Si/SiO_2/SiN_x$ stacks in lot DI0206 of Example II.

$S_{\mathit{eff}}$ drops and minority carrier lifetime $\tau_{\mathit{eff}}$ improves significantly for the semiconductor with charged overlying films. From the experimental results, $\tau_{\mathit{eff}}$ increased significantly for wafers with either positive or negative corona charged $SiN_x$ films, as shown in FIG. 13 and FIG. 14. Due to the fact that these wafers are CZ wafers, the bulk time is the upper limit of the total effective lifetime. The low bulk life may be the reason that these lifetimes did not increase dramatically after charging compared to others' experimental results on float-zone (FZ) wafers.

Effective lifetimes were measured at the same minority carrier density (MCD) of $7 \times 10^{15}$ cm$^{-3}$ in the following fabrication processes: as-deposited of $SiN_x$, after FGA of $SiN_x$, and after negative/positive charging. According to FIG. 13, lifetimes increased after both FGA and negative charging. FGA is a hydrogen passivation method, and the charged insulating film provides good field-effect passivation. However, the charging process may create more interface states because of charge transport between the Si substrate and insulator film. The effective lifetime reached to the upper limit due to a low bulk lifetime. The average improvement of lifetime after negative charging for DI0188 was 120% compared to the as-deposited lifetime. FIG. 14 shows the lifetime of positive charged samples, also at the MCD of $7 \times 10^{15}$ cm$^{-3}$. The positive charging resulted in significant improvement of effective lifetime, even compared to that after FGA. The average improvement of effective lifetime after positive charging for DI0206 was 410% compared to the as-deposited lifetime.

The present invention has been described in terms of one or more preferred embodiments, and it should be appreciated that many equivalents, alternatives, variations, and modifications, aside from those expressly stated, are possible and within the scope of the invention.

What is claimed is:

1. A method for making a solar cell, the method comprising:
    (a) providing a stack including a substrate, a barrier layer disposed on the substrate, and an anti-reflective layer disposed on the barrier layer, the anti-reflective layer having charge centers;
    (b) generating a corona with a charging tool; and
    (c) contacting the anti-reflective layer with the corona thereby injecting charge into at least some of the charge centers in the anti-reflective layer,
    wherein the charge is uniformly distributed throughout the anti-reflective layer; and
    wherein a thickness of the barrier layer is sufficient to prevent electron tunneling from the substrate to the anti-reflective layer without negating effects of the introduced charge in the antireflective layer.

2. The method of claim 1, wherein step (a) comprises
    (i) providing a silicon substrate;
    (ii) forming a silicon dioxide barrier layer on the substrate; and
    (iii) forming a silicon nitride anti-reflective layer on the barrier layer.

3. The method of claim 1, wherein the substrate comprises a doped semiconductor material.

4. The method of claim 1, wherein the barrier layer is of a thickness in a range of 15 nanometers to 50 nanometers.

5. The method of claim 1, wherein the charging tool comprises a wire assembly configured to receive a voltage for generating the corona.

6. The method of claim 5, wherein the wire assembly comprises at least one wire having a diameter in a range of 100 micrometers to 1000 micrometers.

7. The method of claim 1, wherein the anti-reflective layer is of a thickness in a range of 10 nanometers to 500 nanometers.

8. The method of claim 1, further comprising:
    (d) exposing the anti-reflective layer to ultraviolet radiation.

9. The method of claim 8, wherein the ultraviolet radiation has a wavelength of 300 nanometers or less.

10. The method of claim 1, wherein the charge centers are amphoteric.

11. The method of claim 1, wherein negative charge is injected into at least some of the charge centers in the anti-reflective layer.

12. The method of claim 1, wherein positive charge is injected into at least some of the charge centers in the anti-reflective layer.

13. The method of claim 11, wherein step (a) comprises
    (i) providing a silicon substrate;
    (ii) forming a silicon dioxide barrier layer on the substrate; and
    (iii) forming a silicon nitride anti-reflective layer on the barrier layer.

14. The method of claim 11, wherein the substrate comprises a doped silicon material.

15. The method of claim 11, wherein the anti-reflective layer is of a thickness in a range of 10 nanometers to 500 nanometers, and the barrier layer is of a thickness in a range of 15 nanometers to 50 nanometers.

16. A method for making a thin film solar cell, the method comprising:
    (a) providing a stack including a substrate, a barrier layer disposed on the substrate, and an anti-reflective layer disposed on the barrier layer, the anti-reflective layer having charge centers;
    (b) generating a corona with a negative polarity charging tool; and
    (c) contacting the anti-reflective layer with the corona thereby injecting negative charge into at least some of the charge centers in the anti-reflective layer,
    wherein the charge is uniformly distributed throughout the anti-reflective layer, and
    wherein a thickness of the barrier layer is sufficient to prevent electron tunneling from the substrate to the anti-reflective layer without negating effects of the introduced charge in the antireflective layer.

17. A method for making a thin film solar cell, the method comprising:

(a) providing a stack including a substrate, a barrier layer disposed on the substrate, and an anti-reflective layer disposed on the barrier layer, the anti-reflective layer having charge centers;
(b) generating a corona with a bipolar charging tool; and
(c) contacting the anti-reflective layer with the corona thereby injecting positive or negative charge into at least some of the charge centers in the anti-reflective layer, wherein the charge is uniformly distributed throughout the anti-reflective layer, and wherein a thickness of the barrier layer is sufficient to prevent electron tunneling from the substrate to the anti-reflective layer without negating effects of the introduced charge in the antireflective layer.

18. The method of claim 17, wherein step (a) comprises
(i) providing a silicon substrate;
(ii) forming a silicon dioxide barrier layer on the substrate; and
(iii) forming a silicon nitride anti-reflective layer on the barrier layer.

19. The method of claim 17, wherein the anti-reflective layer is of a thickness in a range of 10 nanometers to 500 nanometers, and the barrier layer is of a thickness in a range of 15 nanometers to 50 nanometers.

20. The method of claim 17, further comprising:
(d) exposing the anti-reflective layer to ultraviolet radiation, wherein the ultraviolet radiation has a wavelength of 300 nanometers or less.

* * * * *